(12) United States Patent
Cheng et al.

(10) Patent No.: US 10,446,682 B2
(45) Date of Patent: Oct. 15, 2019

(54) METHOD OF FORMING SEMICONDUCTOR DEVICE

(71) Applicant: UNITED MICROELECTRONICS CORP., Hsin-Chu (TW)

(72) Inventors: Chi-Hsuan Cheng, Kaohsiung (TW); Cheng-Pu Chiu, New Taipei (TW); Yu-Chih Su, Tainan (TW); Chih-Yi Wang, Tainan (TW); Chin-Yang Hsieh, Tainan (TW); Tien-Shan Hsu, Tainan (TW); Yao-Jhan Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/244,076

(22) Filed: Jan. 9, 2019

(65) Prior Publication Data

US 2019/0148550 A1 May 16, 2019

Related U.S. Application Data

(62) Division of application No. 15/696,201, filed on Sep. 6, 2017, now Pat. No. 10,217,866.

(30) Foreign Application Priority Data

Jul. 19, 2017 (TW) .............................. 106124194 A (51) Int. Cl.
*H01L 29/78* (2006.01)
*H01L 21/8238* (2006.01)
*H01L 27/092* (2006.01)
*H01L 29/06* (2006.01)

(52) U.S. Cl.
CPC .. *H01L 29/7846* (2013.01); *H01L 21/823821* (2013.01); *H01L 21/823878* (2013.01); *H01L 27/0924* (2013.01); *H01L 29/0653* (2013.01)

(58) Field of Classification Search
CPC ......... H01L 29/7846; H01L 21/823821; H01L 27/0924; H01L 21/823878; H01L 29/0653
USPC ......................................................... 257/369
See application file for complete search history.

(56) References Cited

U.S. PATENT DOCUMENTS

| 9,608,062 | B1 | 3/2017 | Tseng et al. |
| 10,217,866 | B2 * | 2/2019 | Cheng ................. H01L 29/7846 |
| 2015/0214341 | A1 | 7/2015 | Shin et al. |
| 2017/0170278 | A1 | 6/2017 | Peng |

* cited by examiner

*Primary Examiner* — Caleen O Sullivan
(74) *Attorney, Agent, or Firm* — Winston Hsu (57) ABSTRACT

A semiconductor device and a method of forming the same, the semiconductor device includes a first and a second fin structures, a first, a second and a third isolation structures, and a first and a second gate structures. The first and second fin structures are disposed in a substrate. The first isolation structure is disposed in the substrate and surrounds the first and second fin structures. The second isolation structure is disposed in the first fin structure, and a top surface of the second isolation structure is leveled with a top surface of the first and second fin structures. The third isolation structure is disposed in the second fin shaped structure, and a top surface of the third isolation structure is lower than the top surface of the first and second fin structures. The first and second gate structures are disposed on the second and third isolation structures, respectively.

8 Claims, 8 Drawing Sheets

METHOD OF FORMING SEMICONDUCTOR DEVICE

CROSS REFERENCE TO RELATED APPLICATIONS

This application is a Divisional of application Ser. No. 15/696,201 filed Sep. 6, 2017, and included herein by reference.

BACKGROUND OF THE INVENTION

1. Field of the Invention

The present invention relates to a semiconductor device and a method of forming the same, and more particularly, to a semiconductor device having multiple isolation structure and a method of forming the same.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased.

However, under the requirements of continuous miniaturization, the designs and fabricating processes of current FinFET structure still face more challenges and limitations, leading to current leakage and poor electrical performance thereby. Hence, how to improve the current FinFET fabrication and structure for resolving this issue has become an important task in this field.

SUMMARY OF THE INVENTION

It is one of the primary objectives of the present invention to provide a semiconductor device and a method of forming the same, in which, different isolation structures are formed respectively on two fin shaped structures, so as to improve the isolation function and to provide corresponding stress thereto. In this way, it is sufficient to obtain a more reliable semiconductor device.

To achieve the purpose described above, the present invention provides a semiconductor device including a first fin shaped structure and a second fin shaped structure, a first isolation structure, a second isolation structure and a third isolation structure, and a first gate and a second gate. The first fin shaped structure and the second fin shaped structure are disposed on a substrate. The first isolation structure is disposed on the substrate and surrounds the first the first fin shaped structure and the second fin shaped structure. The second isolation structure is disposed in the first fin shaped structure, and a top surface of the second isolation structure is leveled with a top surface of the first fin shaped structure. The third isolation structure is disposed in the second fin shaped structure, and a top surface of the third isolation structure is lower than a top surface of the second fin shaped structure. The first gate and a second gate are respectively disposed on the second isolation structure and the third isolation structure.

To achieve the purpose described above, the present invention provides a method of forming a semiconductor device including the following steps. First of all, a substrate is provided, and a portion of the substrate is removed to form a first trench to surround a first fin shaped structure and a second fin shaped structure in the substrate. Then, a portion of the first fin shaped structure is removed to form a second isolation structure in the first fin shaped structure. After forming the second isolation structure, a first isolation structure is formed in the first trench to surround the first fin shaped structure and the second fin shaped structure. Next, a portion of the first fin shaped structures and a portion of the first isolation structure are removed to form a third isolation structure in the second fin shaped structure. Finally, a first gate is formed on the second isolation structure, and a second gate is formed on the third isolation structure.

Overall speaking, through the method of the present invention, two isolation structures with different materials, different heights and different structures are respectively formed on two different fin shaped structures. The two isolation structures may be applied on a PFET/NFET device, to provide the required isolation between the two fin shaped structures. Furthermore, the two isolations structures may also provide suitable stresses to the channel regions of the PFET/NFET device, so that, it is sufficient to obtain a more reliable semiconductor device in the present invention The two isolation structures may isolate the two fin shaped structures, and further provide suitable stresses to the channel regions of a PFET/NFET device which is formed subsequently on the two fin shaped structures. The isolation structure disposed in the PFET device preferably includes a monolayer structure, and which is disposed directly on the top surface of the fin shaped structure. On the other hand, the isolation structure disposed in the NFET device preferably includes a multilayer structure, and which is partially disposed within the fin shaped structure, with the top surface thereof being lower than the top surface of the fin shaped structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 10 are schematic diagrams illustrating a method of forming a semiconductor device according to a first preferred embodiment of the present invention, in which:

FIG. 12 to FIG. 13 are schematic diagrams illustrating a method of forming a semiconductor device according to a second preferred embodiment of the present invention, in which:

DETAILED DESCRIPTION

To provide a better understanding of the presented invention, preferred embodiments will be described in detail. The preferred embodiments of the present invention are illustrated in the accompanying drawings with numbered elements.

Please refer to FIG. 1 to FIG. 10, which are schematic diagrams illustrating a method of forming a semiconductor device according to the first embodiment of the present invention, wherein FIGS. 1, 3, 4, 6 and 8 show top views of the semiconductor device in forming steps, and others drawings show cross-sectional views taken along the cross lines A-A, B-B' in forming steps.

Figure 1:
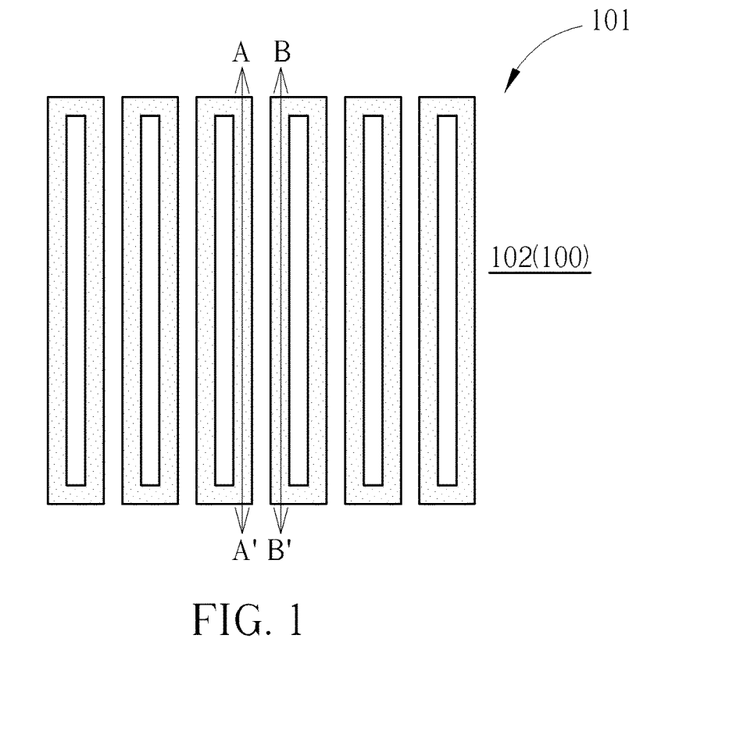
FIG. 1 shows a top view of a semiconductor device after forming fins.
Figure 2:
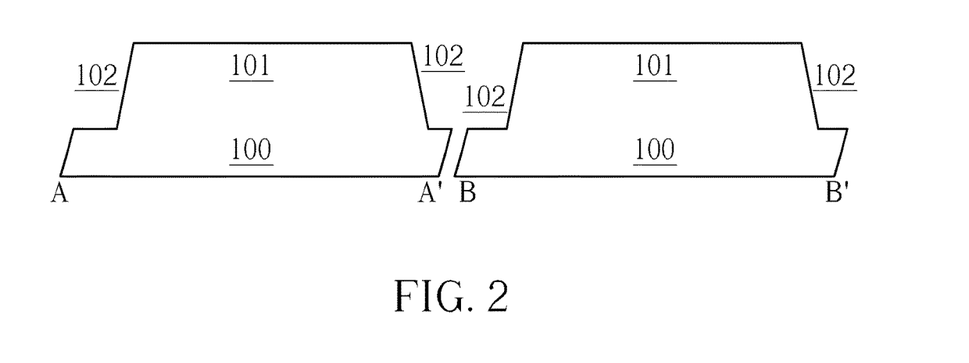
FIG. 2 shows a cross-sectional view taken along cross lines A-A, B-B, in FIG. 1.

First of all, a substrate 100 is provided, and the substrate 100 for example includes a silicon substrate, a silicon-containing substrate or a silicon-on-insulator (SOI) substrate. A plurality of fins 101 are formed on a surface of the substrate 100, with each of the fins 101 having a closed rectangular frame, parallel extended along a same direction (not shown in the drawings, such as a y-direction), as shown FIG. 1. In one embodiment, the formation of the fins 101 is for example accomplished through a sidewall image transfer (SIT) technique. The SIT technique may include performing a lithography and etching process on a bulk silicon substrate (not shown in the drawings), to form a plurality of patterned sacrificial layers (not shown in the drawings), next performing a depositing and an etching processes sequentially to form a spacer (not shown in the drawings) at sidewalls of each of the patterned sacrificial layers, and then removing the patterned sacrificial layers and performing another etching process by using the spacer as a mask. That is, a plurality of shallow trenches 102 is formed in the bulk silicon substrate, the un-etched portions of the bulk silicon substrate are therefore defined as the fins 101, and the rest bulk silicon substrate under the fins 101 and the trenches 102 forms the substrate 100, as shown in FIGS. 1-2.

Figure 3:
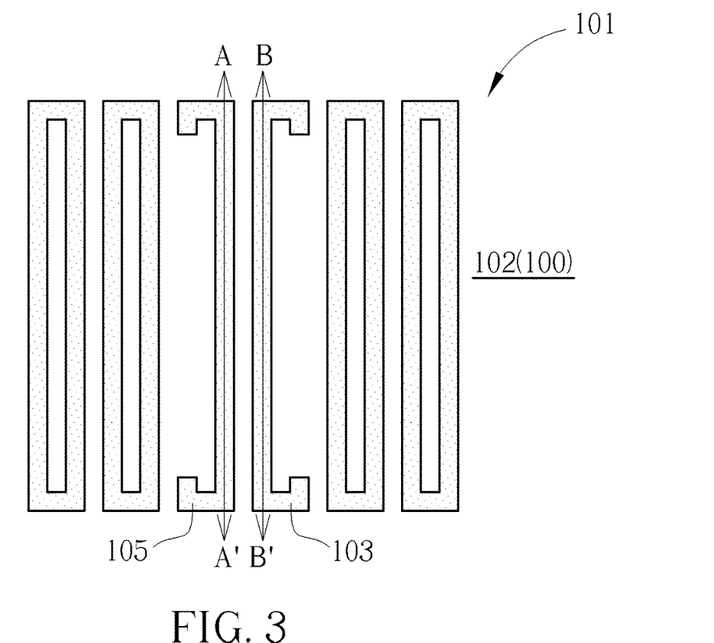
FIG. 3 shows a top view of a semiconductor device after performing a fin removing process.
Figure 4:
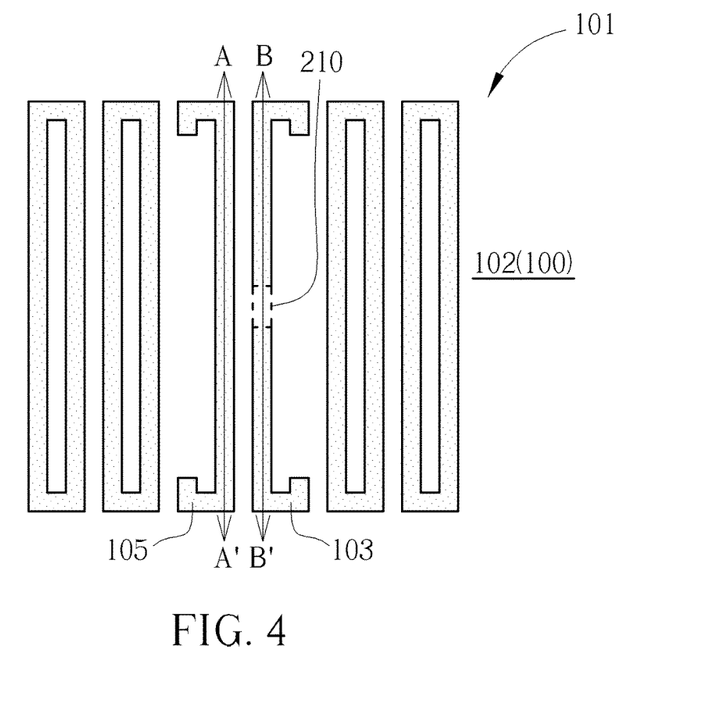
FIG. 4 shows a top view of a semiconductor device after forming an isolation structure.

Then, a fin-removing process is performed, to remove a portion of the fins 101. In the present embodiment, a patterned mask (not shown in the drawings) may be formed to cover the majority of fins 101, with the rest portions of the fins 101 being exposed therefore, and an etching process is performed, to remove the rest portion of the fins 101 exposed from the patterned mask. That is, the closed rectangular frames of some fins 101 are partially removed, to form fin shaped structure 103, 105, as shown in FIG. 3.

Figure 5:
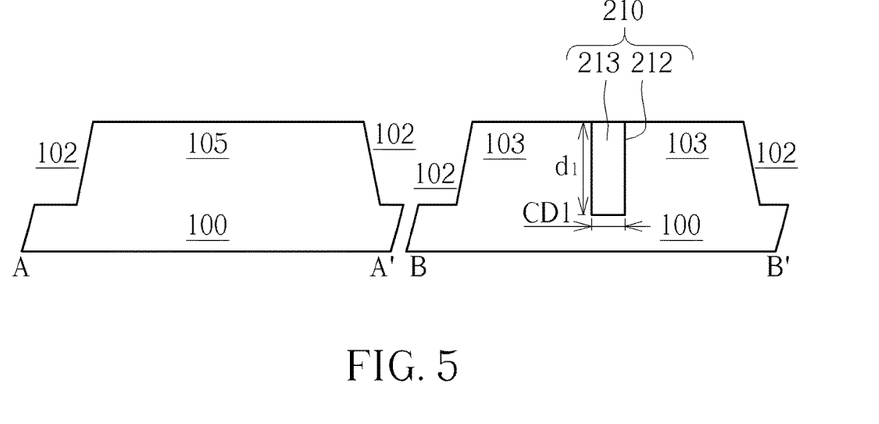
FIG. 5 shows a cross-sectional view taken along cross lines A-A, B-B, in FIG. 4.

Next, an isolation structure 210 is formed in the fin shaped structure 103. Precisely, the formation of the isolation structure 210 is accomplished by first performing an etching process, to remove a portion of the fin shaped structure 103 to form a trench 212 in the fin shaped structure 103, and next performing a depositing and etching back process, to fill up the trench 212 with an isolating material 213. In the present embodiment, the isolation structure 210 for example includes a monolayer structure as shown in FIG. 5, and a top surface of the isolation structure 210 is preferably leveled with a top surface of the fin shaped structure 103. The monolayer structure of the isolation structure 210 may include silicon oxide ($SiO_x$), but is not limited thereto. However, people well skilled in the arts should fully understand that the isolation structure 210 is not limited to be formed in a greater depth d1 and a smaller dimension CD1 in comparison with that of the shallow trench 102, and the practical features thereof can be further adjusted according to the product requirements. For example, in another embodiment, the isolation structure is formed with a depth and/or a dimension being smaller or the same as that of the shallow trench 102.

Figure 6:
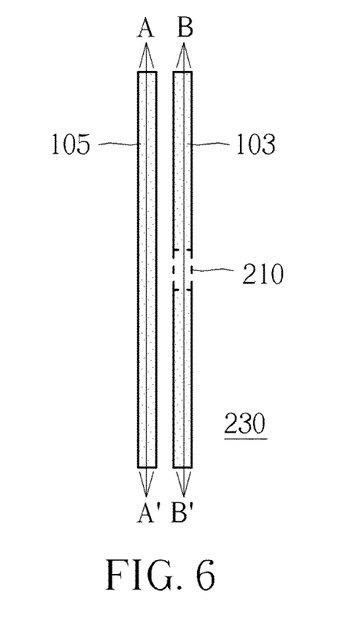
FIG. 6 shows a top view of a semiconductor device after performing a fin curing process.

Following these, a fin-cutting process is performed, to remove unnecessary fins 101, and unnecessary portions of the fin shaped structures 103, 105, such as the two ends of each fin shaped structures 103, 105, to form the fin shaped structures 103, 105 as shown in FIG. 6. Please note that, the detailed steps and process conditions of the fin-cutting process are substantially similar to those in the aforementioned fin-removing process, and will not be redundantly described herein. However, the fin shaped structures 103, 105 as shown in FIG. 6 is not limited to be formed through aforementioned processes, in another embodiment, the formation of the fin shaped structures 103, 105 may also be accomplished by first forming a patterned hard mask (not shown in the drawings) on the substrate 100, and then performing an epitaxial process on the exposed substrate 100 through the patterned hard mask to form a semiconductor layer (not shown in the drawings), such as silicon or silicon germanium layer, to be used as the corresponding fin shaped structures.

Figure 7:
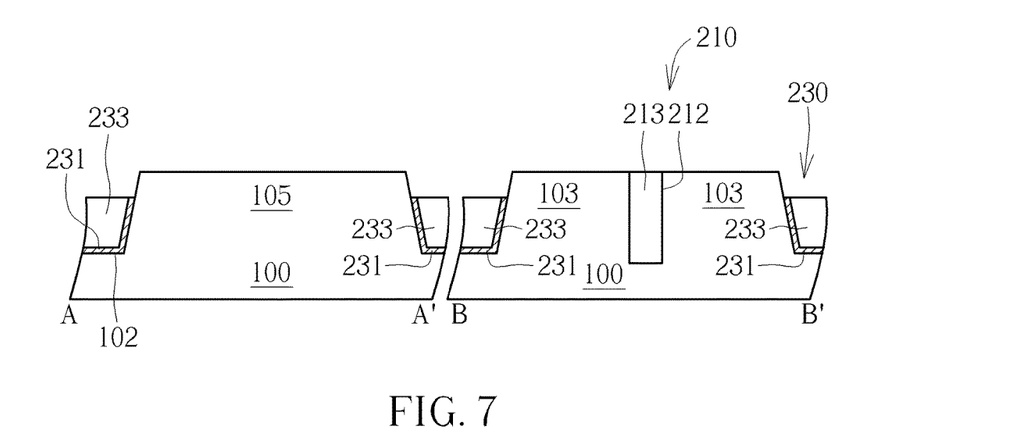
FIG. 7 shows a cross-sectional view taken along cross lines A-A, B-B, in FIG. 6.
Figure 8:
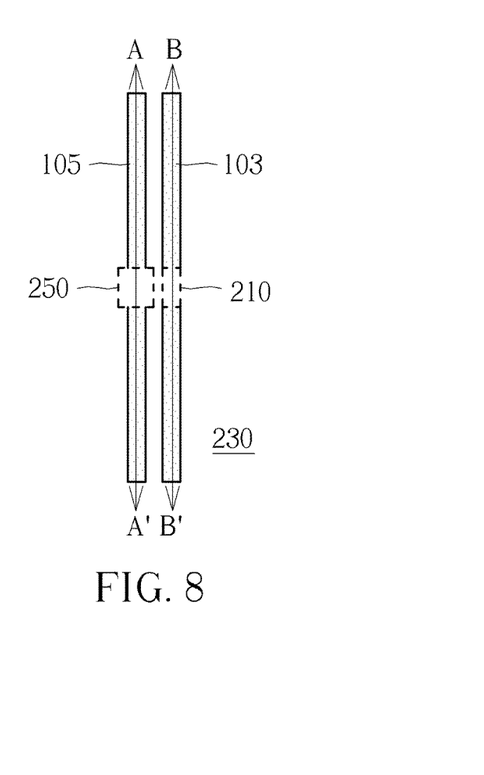
FIG. 8 shows a top view of a semiconductor device after forming another isolation structure.

Then, another depositing and etching back process is performed, to form another isolation structure 230 partially filled in the shallow trench 102. The isolation structure 230 for example includes a multilayer structure as shown in FIG. 7, and the multilayer structure may include a liner 231, such as including silicon oxide, disposed on surfaces of the shallow trench 102, and an insulating material 233, such as including silicon nitride (SiN) or silicon oxynitride (SiON), partially filled in the shallow trench 102, but is not limited thereto. In is noted that, in comparison with the isolation structure 210 formed in the fin shaped structure 103, the isolation structure 230 only filled in a bottom portion of the shallow trench 102 instead of filling up the entire shallow trench 102. That is, a top surface of the isolation structure 230 is lower than the top surface of the isolation structure 210, as well as the top surfaces of the fin shaped structures 103, 105, as shown in FIG. 7.

Figure 9:
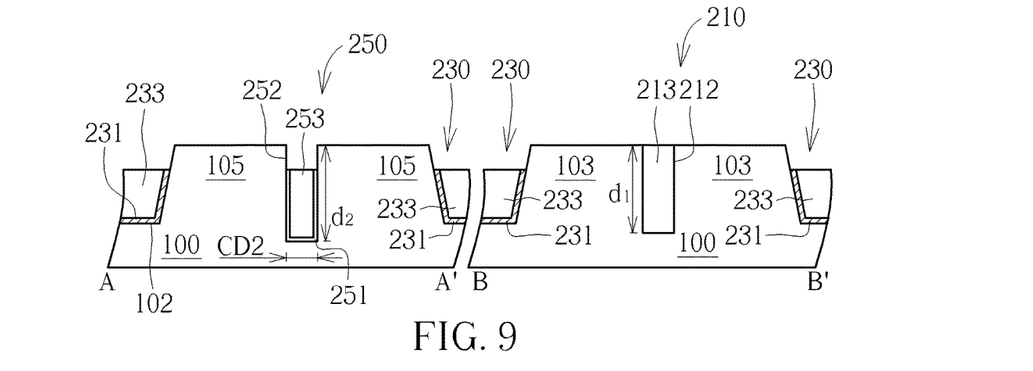
FIG. 9 shows a cross-sectional view taken along cross lines A-A, B-B, in FIG. 8.

After that, another isolation structure 250 is further formed in the fin shaped structure 105. The forming process of the isolation structure 250 is substantially similar to those of the isolation structure 210, for example including first performing an etching process, to remove a portion of the fin shaped structure 105 and a portion of the isolation structure 230 disposed at two sides of the fin shaped structure 105 to form a trench 252, and performing at least one depositing and etching back processing, to form isolation materials 251, 253 stacked one over another in the trench 252. In the present embodiment, the isolation structure 250 for example includes a multilayer structure as shown in FIG. 9, and the multilayer structure may include an insulating material 251, such as including silicon oxide, disposed on surfaces of the trench 252, and an insulating material 253, such as including silicon nitride, silicon oxynitride or silicon carbonitride (SiCN), partially filled in the trench 252, but is not limited thereto.

Figure 11:
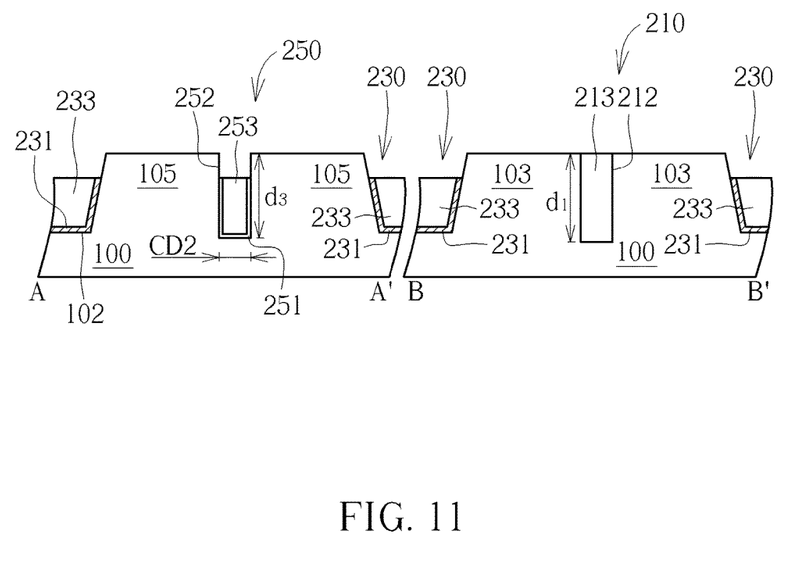
FIG. 11 is a schematic diagram illustrating a method of forming a semiconductor device according to another preferred embodiment of the present invention.

Furthermore, people well skilled in the arts should fully understand that the isolation structure 250 is not limited to be formed in a different depth d2 and a similar dimension CD2 in comparison with that of the isolation structure 210, and the practical features thereof can be further adjusted according to the product requirements. For example, in one embodiment, the isolation structure 250 is formed in a greater depth d2 than the depth d1 of the isolations structure 210, and the depths d1, d2 of the isolation structures 210, 250 are all greater than that of the shallow trench 102 (namely the isolation structure 230), as shown in FIG. 9. In another embodiment, the isolation structure 250a may also be formed in a smaller depth d3 than the depth d1 of the isolations structure 210, as shown in FIG. 11, or in other embodiment, the isolation structure may also be formed in the same depth and/or the same dimension as that of the shallow trench 102.

In is also noted that, in comparison with the isolation structure 210 formed in the fin shaped structure 103, the isolation structure 250 only filled in a bottom portion of the trench 252 instead of filling up the entire trench 252. That is, a top surface of the isolation structure 250 is lower than the top surface of the isolation structure 210, as well as the top surfaces of the fin shaped structures 103, 105, as shown in FIG. 9. Also, the top surface of the isolation structure 250 may be optionally leveled with the top surface of the isolation structure 230, as shown in FIG. 9, or top surface (not shown in the drawings) of the isolation structure 250 may be higher or lower than the top surface of the isolation structure 230.

Next, a plurality of gates 300 are formed on the substrate 100, and the gates 300 are extended along a direction such as the x-direction which is different from the fin shaped structures 103, 105, so as to cross the fin shaped structures 103, 105. In the present embodiment, the forming process of each gate 300 may be integrated with a general gate forming process. For example, a heating process, such as an in situ steam generation (ISSG) process, may be performed to form a dielectric layer (not shown in the drawings) for example including oxide on the surfaces of the fin shaped structures 103, 105, a depositing process is then performed, to form a gate layer (not shown in the drawings), and a patterning process is performed to pattern the gate layer and the dielectric layer, to form a plurality of stack structures (not shown in the drawings). Thus, each stacked structure may include a gate dielectric layer 301 and a gate electrode 303, and a spacer 305 is formed next to surround each stacked structure, so as to form the gates 300.

Figure 10:
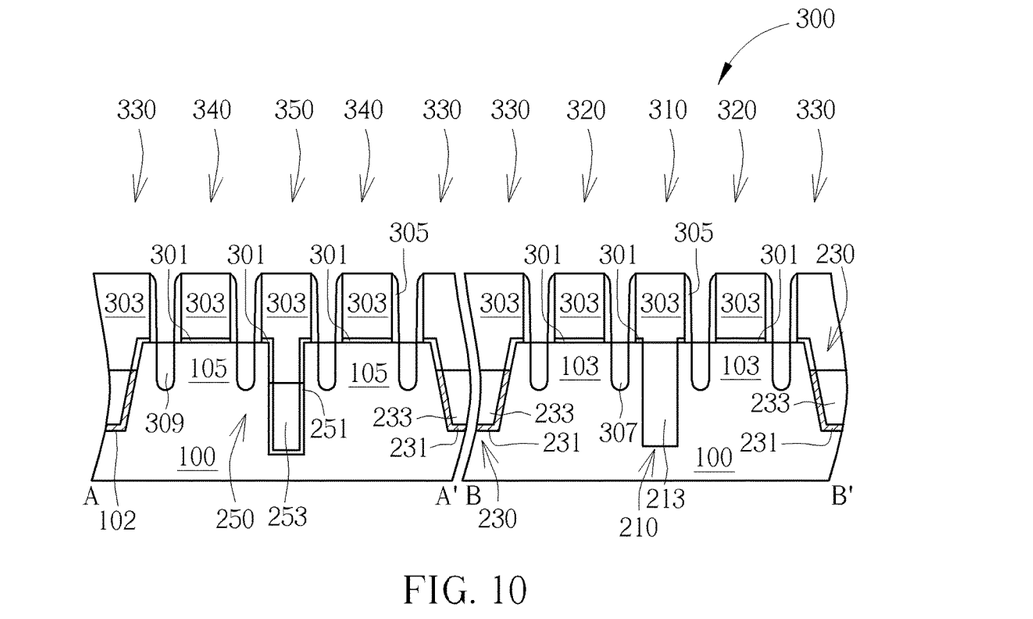
FIG. 10 shows a cross-sectional view of a semiconductor device after forming gate structures.

As shown in FIG. 10, among these gates 300, a portion of the gates 320, 340 are formed to directly cross the fin shaped structures 103, 105, and the rest of the gates 310, 330, 350 are formed to cross the isolation structures 210, 230, 250, to function like a dummy gate. It is noted that, the gates 310, 350 are disposed on the isolation structures 210, 250, respectively, in which, the gate 310 covers the entire isolation structure 210 with a bottom surface of the gate 310 leveled with the top surface of the fin shaped structure 103. On the other hand, the gate 350 also covers the entire isolation structure 250 with a portion of the gate 350 (namely a portion of the gate electrode 303) further extended into the upper portion of the trench 252. That is, a bottom surface of the gate 350 may be lower than the top surface of the fin shaped structure 103 instead of being leveled with that.

Finally, a plurality of doped regions 307, 309 is formed in the fin shaped structures 103, 105. The doped regions 307 are formed at two sides of the gates 310, 320, 330, in the fin shaped structures 103, and have a dopant having a first conductive type, such as a p-type dopant. On the other hand, the doped regions 309 are formed at two sides of the gates 340, 350 in the fin shaped structures 105, and have a dopant having a second conductive type which is complementary to the first conductive type, such as a n-type dopant. In this way, after performing a salicide forming process, a contact etch stop layer (CESL) process or a replacement metal gate (RMG) process in the subsequent processes, the gates 320 disposed on the fin shaped structure 103 and the doped regions 307 may further form a p-type field effect transistor (PFET) device, and the gates 340 disposed on the fin shaped structure 105 and the doped regions 309 may further form a n-type field effect transistor (NFET) device.

According to the above processes, the method of forming a semiconductor device of the first embodiment of the present invention is accomplished. In the forming processes of the present embodiment, two isolation structures 210, 250 having different materials, different heights and structures are respectively formed on two parallel disposed fin shaped structures 103, 105, with the isolation structures 210 having a monolayer structure, and the top surface thereof being leveled with the top surface of the fin shaped structure 103, and with the isolation structure 250 having a multilayer structure, and the top surface thereof begin lower than the top surface of the fin shaped structure 105. Then, the gate 310 formed subsequently on the isolation structure 210 may be disposed on the top surface of the fin shaped structure 103, and the gate 350 formed subsequently on the isolation structure 250 may be partially disposed within the fin shaped structure 103.

With these arrangements, the isolation structures 210, 250 formed in the two fin shaped structures 103, 105 respectively may function like two isolation element of the fin shaped structures 103, 105, thereto improve the current leakage issues and electrical performance of the entire device. Also, the isolation structures 210, 250 may be further applied on a PFET device or a NFET device respectively, through disposing such isolation structure 210 under a dummy gate in the PFET device and/or disposing such isolation structure 250 under a dummy gate in the NFET device, to provide required stresses to the PFET device and/or NFET device. That is, a more reliable semiconductor device can be obtained thereby.

People well skilled in the arts should fully understand that, the semiconductor device of the present invention is not limited to be formed through the above mentioned processes, and may also be formed through other processes. For example, the isolation structures 210, 230, 250 may not be formed in aforementioned sequence and processes, and in another embodiment, the formations of the isolation structures 230, 250 are integrated in the same process, for example forming the isolation structures 230, 250 simultaneously after forming the trench 252, instead of first forming the isolation structures 230 after the fin-cutting process. In this way, the semiconductor device of the present invention is formed in a simplified process, and the top surfaces of the isolation structures 230, 250 formed thereby may be leveled with each other, and both lower than that of the fin shaped structures 103, 105. Also, in another embodiment, the isolation structure 230 may be formed firstly, followed by simultaneously defining trenches 212, 252 in the fin shaped structures 103, 105, and respectively forming the isolation structures 210, 250 in the trenches 212, 252 under the covering of a mask (not shown in the drawings). Otherwise, the isolation structures 210, 250 are formed firstly, followed by forming the isolation structure 230 in the shallow trench 102. In this way, the semiconductor device of the present invention is formed in a simplified process, and the isolation structures 210, 250 formed thereby may have the same depth and the dimension.

The following description will detail the different embodiments of the semiconductor device and the forming method thereof of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 12:
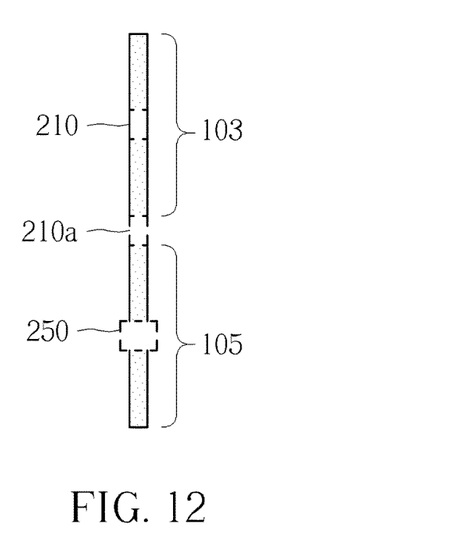
FIG. 12 shows a top view of a semiconductor device after forming an isolation structure.
Figure 13:
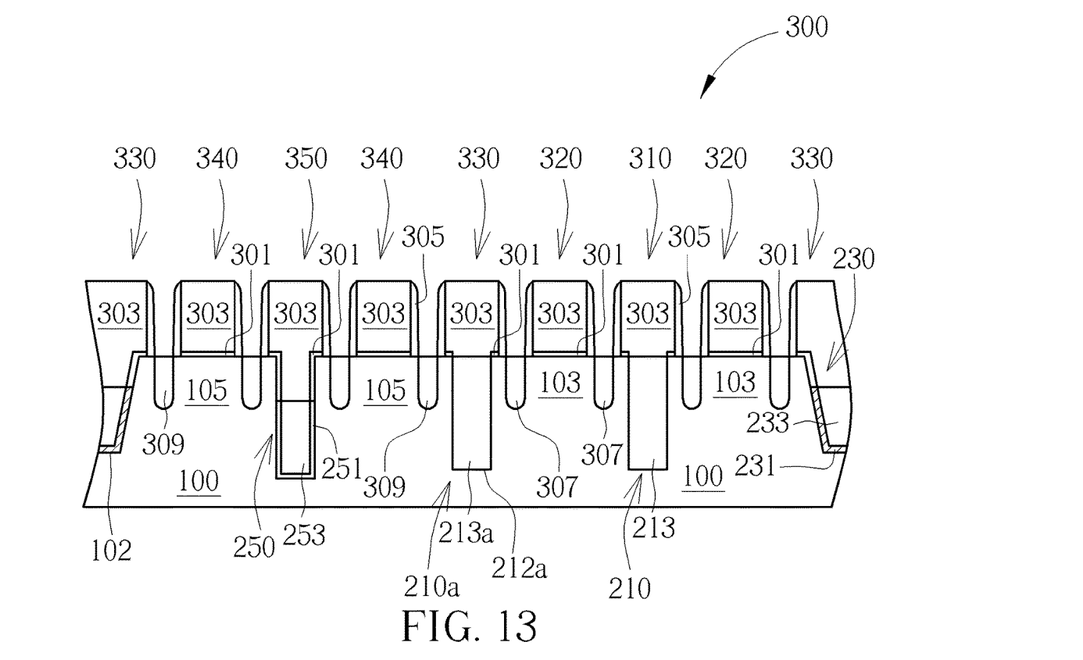
FIG. 13 shows a cross-sectional view of a semiconductor device after forming gate structures.

Please refer to FIG. 12 and FIG. 13, which are schematic diagrams illustrating a method of forming a semiconductor device according to the second embodiment of the present invention. The formal steps in the present embodiment are similar to those in the first embodiment, and which includes forming the fin shaped structures 103, 105, and isolation structures 210, 230, 250 disposed on the fin shaped structure 103, 105. However, the differences between the present embodiment and the aforementioned first embodiment are that, the fin shaped structures 103, 105 are not parallel disposed from each other, and which are disposed sequentially along the same direction, such as the y-direction, as shown in FIG. 12.

It is noted that, an isolation structure 210a is further formed between the two fin shaped structures 103, 105, to isolate the two fin shaped structures 103, 105 thereby. The isolation structure 210a may be formed while the isolation structure 210 is formed, and the formation thereof may include first performing an etching process to form a trench 212a, and performing a depositing and etching back process to fill the trench 212a with an isolating material 213a. That is, the isolation structure 210a may also include a monolayer structure as shown in FIG. 13, and a top surface of the isolation structure 210a is leveled with the top surfaces of the fin shaped structures 103, 105. The isolating material 213a preferably includes the same material as the isolating material 213, but is not limited thereto.

Figure 14:
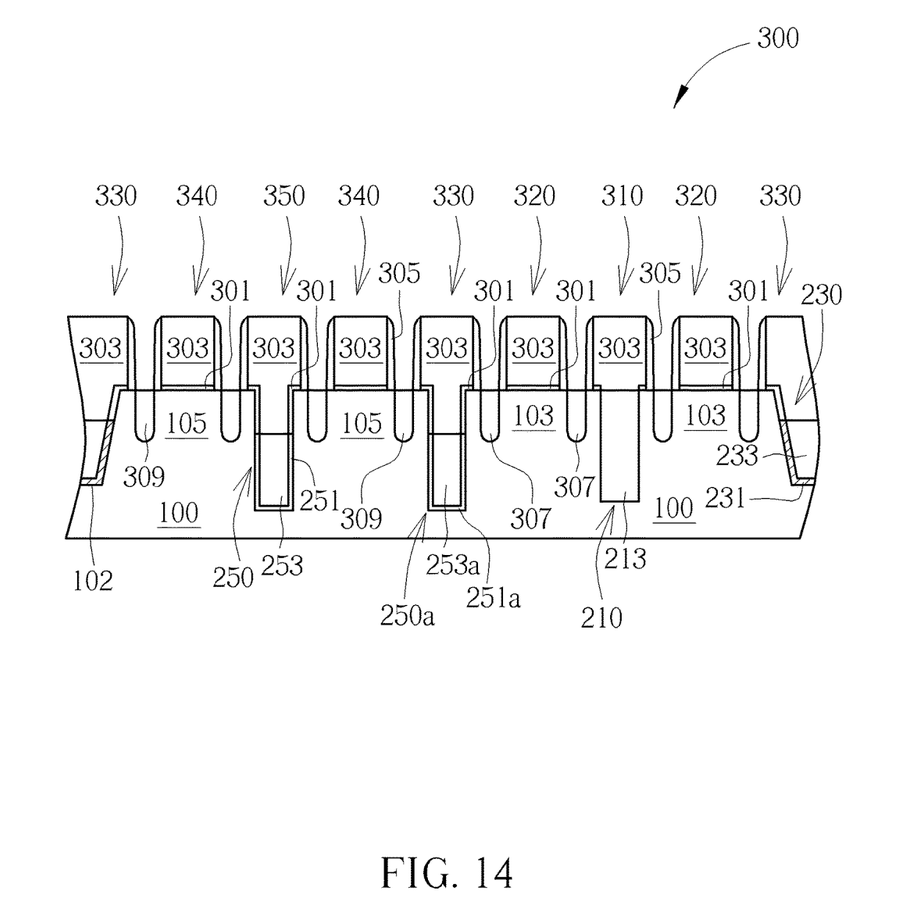
FIG. 14 is a schematic diagram illustrating another cross-sectional view of a semiconductor device according to the other preferred embodiment of the present invention.

Furthermore, in another embodiment, an isolation structure 250a may further be formed between the two fin shaped structures 103, 105, to isolate the two fin shaped structures 103, 105 thereby. The isolation structure 250a maybe formed while the isolation structure 250 is formed, so that, the isolation structure 250a may also include a multilayer structure as shown in FIG. 14, and a top surface of the isolation structure 250a is lower than the top surfaces of the fin shaped structures 103, 105. The isolating material 213a preferably includes the same material as the isolating material 213, but is not limited thereto. The multilayer structure may include an insulating material 251a, such as oxide, covered on surfaces of the trench 252a, and an insulating material 253a, such as SiN, SiON or SiCN, filled in the trench 252a, but is not limited thereto.

According to the above processes, the method of forming a semiconductor device of the second embodiment of the present invention is accomplished. Besides disposing the isolation structures 210, 250 with different materials, different heights and structures in two different fin shaped structures 103, 105, a monolayered isolation structure 210a, or a multilayered isolation structure 250a may be additionally disposed between the two fin shaped structures 103, 105, to further isolate the two fin shaped structures 103, 105. In this way, those disposed isolation structures either within or between the fin shaped structures 103, 105 may provide better functions to improve the current leakage issues and electrical performance of the entire device, and a more reliable semiconductor device can be obtained in the present invention.

Overall speaking, through the method of the present invention, two isolation structures with different materials, different heights and different structures are respectively formed on two different fin shaped structures. The two isolation structures may be applied on a PFET/NFET device, to provide the required isolation between the two fin shaped structures. Furthermore, the two isolations structures may also provide suitable stresses to the channel regions of the PFET/NFET device. It is noted that, the isolation structure disposed in the PFET device preferably includes a monolayer structure, and which is disposed directly on the top surface of the fin shaped structure. On the other hand, the isolation structure disposed in the NFET device preferably includes a multilayer structure, and which is partially disposed within the fin shaped structure, with the top surface thereof being lower than the top surface of the fin shaped structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   providing a substrate;
   removing a portion of the substrate to form a first trench surrounded a first fin shaped structure and a second fin shaped structure;
   removing a portion of the first fin shaped structure to form a second isolation structure in the first fin shaped structure;
   after forming the second isolation structure, forming a first isolation structure in the first trench, surrounded the first fin shaped structure and the second fin shaped structure;
   removing a portion of the second fin shaped structure and a portion of the first isolation structure to form a third isolation structure in the second fin shaped structure; and
   forming a first gate on the second isolation structure, and forming a second gate on the third isolation structure.

2. The method of forming the semiconductor device according to claim 1, further comprising:
   forming a first doped region in the first fin shaped structure, and the first doped region having a first conductive type.

3. The method of forming the semiconductor device according to claim 2, further comprising:
   forming a second doped region in the second fin shaped structure, and the second doped region having a second conductive type being complementary to the first conductive type.

4. The method of forming the semiconductor device according to claim 1, wherein the forming of the third isolation structure comprises:
   forming a second trench in the second fin shaped structure and the first isolation structure;
   forming a first isolating material in the second trench;
   forming a second isolating material filled in the second trench; and
   partially removing the second isolating material and the first isolating material in the second trench.

5. The method of forming the semiconductor device according to claim 4, wherein a portion of the second gate is formed in the second trench.

6. The method of forming the semiconductor device according to claim 1, wherein the forming of the first fin shaped structure and the forming of the second fin shaped structure comprises:
   defining a plurality of fins on the substrate by the first trench, and each of the fins comprises a closed rectangular frame;
   performing a removing process, to partially remove the fins; and
   performing a cutting process, to further remove the fins to form the first fin shaped structure and the second fin shaped structure.

7. The method of forming the semiconductor device according to claim 6, wherein the first isolation structure is formed between the removing process and the cutting process.

8. The method of forming the semiconductor device according to claim 1, wherein the first gate is formed on the first fin shaped structure, and the second gate is partially formed in the second fin shaped structure.

* * * * *